United States Patent [19]
Ruque

[11] Patent Number: 5,712,769
[45] Date of Patent: Jan. 27, 1998

[54] SUBRACK FOR ELECTRONIC CIRCUIT BOARDS

[75] Inventor: Christian Ruque, Corbas, France

[73] Assignee: GEC Alsthom Transport SA, Paris, France

[21] Appl. No.: 547,135

[22] Filed: Oct. 24, 1995

[30] Foreign Application Priority Data

Oct. 27, 1994 [FR] France ................... 94 12879

[51] Int. Cl.⁶ ............................... H05K 7/14; H05K 1/11
[52] U.S. Cl. ...................... 361/796; 361/784; 361/790; 361/803; 439/61
[58] Field of Search .......................... 361/784, 785, 361/790, 796, 803; 439/61, 377

[56] References Cited

U.S. PATENT DOCUMENTS

| | | | |
|---|---|---|---|
| 4,733,461 | 3/1988 | Nakamo | 29/830 |
| 5,040,992 | 8/1991 | Miyamoto et al. | 439/61 |
| 5,259,784 | 11/1993 | Iwatare et al. | 439/377 |
| 5,575,686 | 11/1996 | Noschese | 439/620 |

FOREIGN PATENT DOCUMENTS

0213205 A1   3/1987   European Pat. Off. .
8910 752.7   12/1989  Germany .

*Primary Examiner*—Michael W. Phillips
*Assistant Examiner*—Jayprakash N. Gandhi
*Attorney, Agent, or Firm*—Sughrue, Mion, Zinn, Macpeak & Seas, PLLC

[57] ABSTRACT

In a subrack for electronic circuit boards connected to mother boards the mother boards are disposed in at least two planes parallel to the front face of the subrack. Each plane contains one or more mother boards. The planes are superposed to form a stack in the shape of a pyramid.

11 Claims, 5 Drawing Sheets

5,712,769

SUBRACK FOR ELECTRONIC CIRCUIT BOARDS

BACKGROUND OF THE INVENTION

1. Field of the Invention

The present invention is generally concerned with electronic circuit board support assemblies and is more particularly concerned with a subrack for electronic circuit boards and its case.

2. Description of the Prior Art

Various prior art electronic circuit board support assemblies are used in industry.

A first category of such supports comprises standardized assemblies. They use electronic circuit board subracks known as "Eurofer" subracks.

The basic design of these subracks is based on the use of aluminum sheet and aluminum extrusions.

These prior art subracks have standardized dimensional characteristics.

Electronic circuit boards are mounted perpendicularly to the front face of the subrack and are guided by slideways.

These electronic circuit boards can be connected to electrical connectors attached to the rear face of the subrack.

To the rear of these electrical board connectors are electrical output connectors fixed to the rear face of the subrack.

These electrical connectors provide the electrical connections between boards and/or between the boards and the exterior.

This first category of electronic circuit board support assemblies features automatic unplugging.

This means that to extract the subrack from its case it is not necessary to operate on the connectors.

The drawbacks of these prior art electronic circuit board support assemblies described hereinabove are as follows:

- these assemblies require two levels of floating connectors,
- wiring by means of individual wires and a large number of connector pins lead to long wiring times,
- cost is increased by the large number of boards and connectors,
- the fixing of the floating electronic circuit boards does not provide good resistance to vibration,
- the individual board area is insufficient, and
- the subrack is deep because of the various levels of connection and the direction of the boards.

A second category of electronic circuit board support assemblies encompasses a first solution entailing the provision of a large mother board on which the electronic circuit boards are disposed.

The board connectors are fixed to the mother board.

Output connectors facing towards the front face of the case are fixed to the sides of the large mother board.

The drawbacks of these prior art electronic circuit board support assemblies are as follows:

- the subrack can no longer be unplugged but instead has to be disconnected at the level of connectors which increases the time required to demount the subrack,
- it is mandatory to use connector covers for connecting the subrack, leading to problems with connecting screened cables in the connectors,
- the number of electronic circuit boards is reduced because the output connectors are disposed at the sides of the front face of the mother board,
- the amount of room needed to install the subrack in the case is increased to allow for the problems of access to the output connectors and for cable and connector clearances enabling demounting of the subrack,
- long cables have to be used because of the cable and connector clearances needed to demount the subrack,
- the fixing of the floating electronic circuit boards does not provide good resistance to vibration, and
- the individual board area is insufficient.

Another electronic circuit board support assembly solution in this category disposes the output connectors at the front of the electronic circuit boards.

Connectors mounted on a mother board to the rear of the electronic circuit boards provide the connections between boards.

The drawbacks of these prior art electronic circuit board support assemblies are as follows:

- the subrack can no longer be unplugged but instead has to be disconnected at the level of connectors which increases the time required to demount the subrack, all the more so in that there are many output connectors because they are on the boards,
- it is mandatory to use connector covers for connecting the subrack, leading to problems with connecting screened cables in the connectors,
- the subrack is deep because of the direction of the boards and, in particular, because the output connectors are at the front of the boards,
- the amount of room needed to install the subrack in the case is increased to allow for the cable and connector clearances needed to demount the subrack,
- long cables have to be used because of the cable and connector clearance needed to demount the subrack,
- the fixing of the floating electronic circuit boards does not provide good resistance to vibration, and
- the individual board area is insufficient.

One object of the invention is to design an electronic circuit board subrack that does not have the drawbacks of the prior art support assemblies.

The applicant proposes an electronic circuit board subrack based on a new concept resulting from a new arrangement of mother boards.

SUMMARY OF THE INVENTION

The invention consists in a subrack for electronic circuit boards connected to mother boards disposed in at least two planes, wherein each plane contains one or more mother boards parallel to a front face of said subrack, said mother boards and their electronic circuit boards being superposed to form a stack of compartments in the general shape of a pyramid.

The invention further consists in a subrack having any of the following features:

- said mother boards have connectors on at least one side adapted to receive output connectors, said connectors of one compartment being offset relative to the connectors of any other compartment so that the connectors are not disposed one above the other and are accessible from said front face of said subrack,
- the front face of the case faces the mother board or the set of coplanar mother boards having the smallest area,
- at least one mother board from a compartment n is dispensed with in order to dispose four rows of connectors on the mother board of the next compartment n+1, at least one mother board of a compartment n is offset so that it aligns with one side of the previous compartment n−1 or the next compartment n+1 so that the connectors of said mother board of said compartment n can be disposed on one side of the subrack, all of the compartments are aligned with one side of the subrack so that all of the connectors can be disposed on one side of the subrack, at least one compartment contains a single mother board, at least one compartment contains two mother half-boards, at least one compartment contains four mother quarter-boards, at least one compartment contains one mother half-board and two mother quarter-boards, the mother boards are disposed in planes parallel to the front face of the subrack by means of spacers, at least two mother boards are electrically interconnected by at least one of said electronic circuit boards.

The electronic circuit board subrack has the following advantages:

its modular design can be easily adapted to specific functional requirement, by adaptation of the number of compartments or the height of each compartment, or by multiple association of compartments, or by the choice of mother boards for each compartment, or by the choice of the cable exit points, costs are reduced through the use of large mother boards and/or by reducing the number of mother boards, by choosing the board format most suitable for the specific functional requirement and by reducing wiring by individual wires through the use of mother boards incorporating the output connectors and much of the wiring, reliability is improved through reduction of wiring using individual wires and the number of connection points, the number of output connectors and connectors between boards is reduced through an appropriate choice of mother board area for each compartment, the overall size of the subrack is reduced through the use of large boards, the choice of the mother board area, the incorporation of the output connectors into the volume defined by the front face of the subrack and the number of compartments, the number of output connector clearance areas in the case is reduced, and connecting connectors is facilitated by virtue of the fact that the subrack is shallow and the output connectors are offset as a function of the compartment.

Other objects, features and advantages of the invention will emerge from a reading of the description of preferred embodiments of the electronic circuit board subrack given with reference to the appended drawings.

DETAILED DESCRIPTION OF THE PREFERRED EMBODIMENTS

In a subrack 1 for electronic circuit boards 2A–2C, the electronic circuit boards are connected to mother boards 3A–3C.

In the electronic circuit board subrack of the invention the mother boards are disposed in at least two planes.

Each plane contains one or more mother boards 3A–3C parallel to the front face 6 of the subrack, the mother boards and their electronic circuit boards are stacked to form a stack of compartments A–C in the general shape of a pyramid.

The mother boards 3A–3C preferably have connectors 4A–4C on at least one side adapted to receive output connectors 5A–5C.

The connectors of one compartment are offset relative to the connectors of any other compartment so that the connectors are not disposed one above the other and are accessible from the front face of the subrack.

Figure 1:
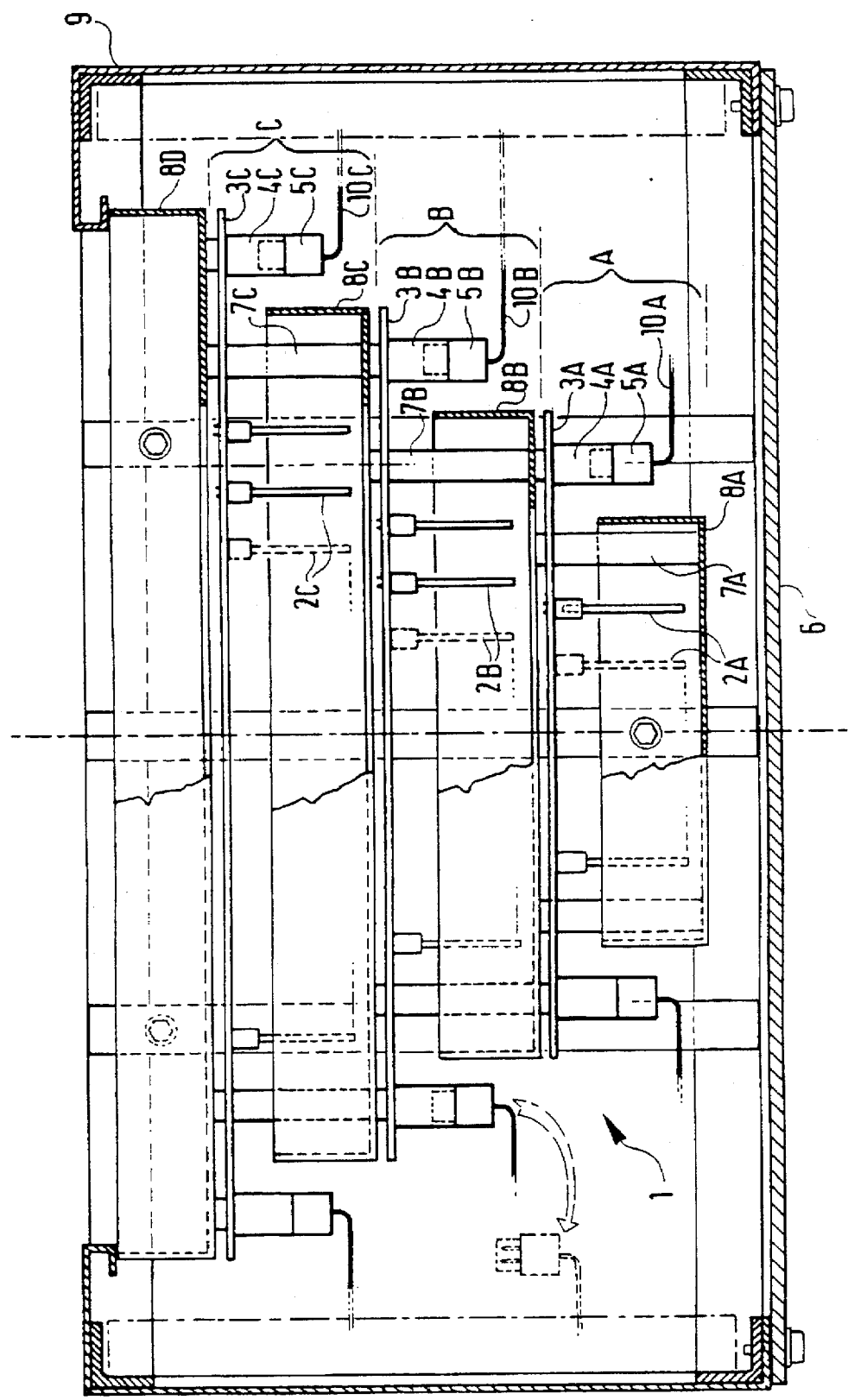
FIG. 1 is a part-sectional top view of a first preferred embodiment of an electronic circuit board subrack of the invention having three compartments.
Figure 2:
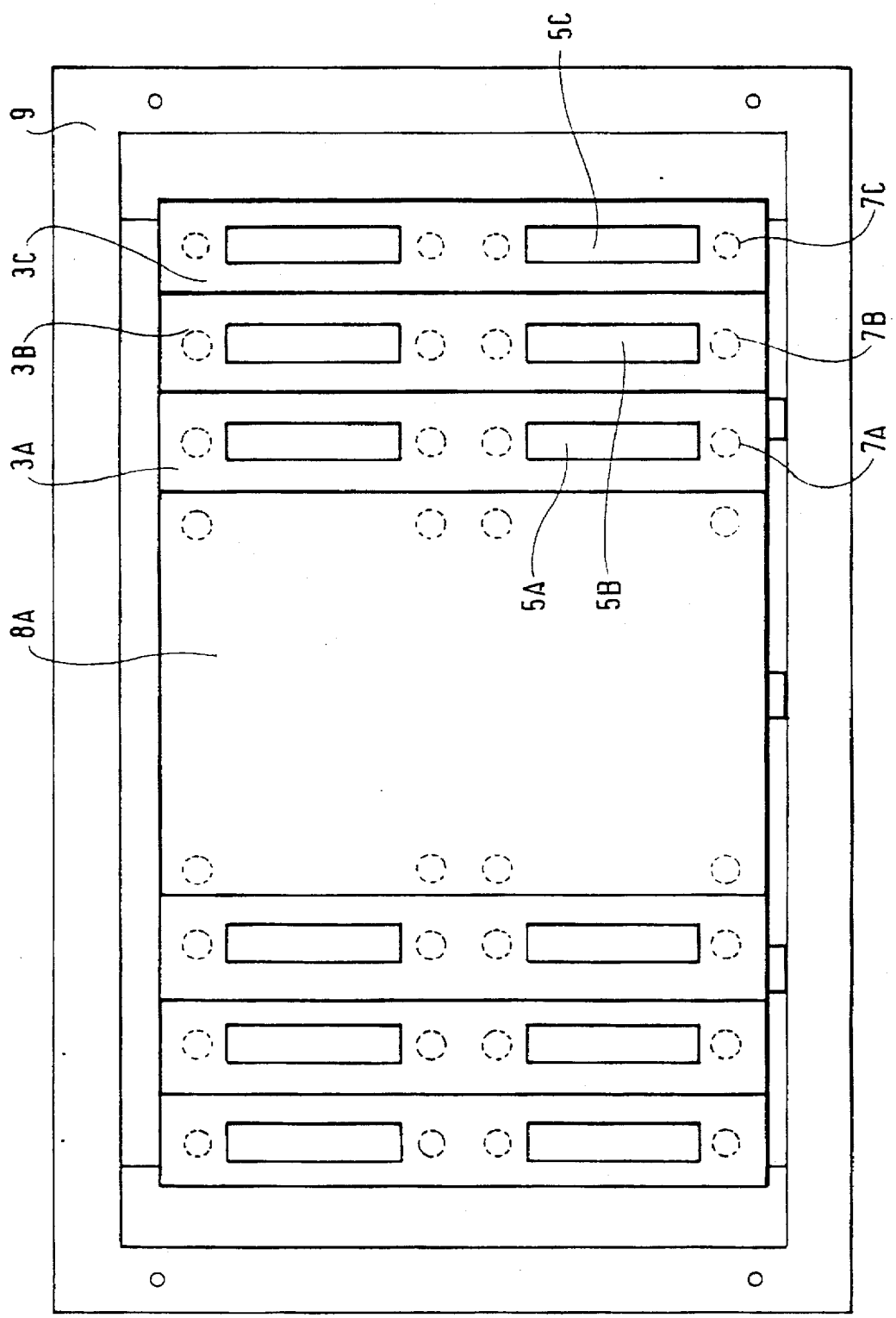
FIG. 2 is a front view of the electronic circuit board subrack shown in FIG. 1.

FIGS. 1 and 2 show two part-sectional top views of a first preferred embodiment of the electronic circuit board subrack of the invention comprising three compartments.

In the first preferred embodiment of the invention, the electronic circuit board subrack 1 contains electronic circuit boards 2A–2C known as daughter boards connected to mother boards 3A–3C.

The mother boards are disposed in at least two planes parallel to a front face 6 of a case 9, each plane containing one or more mother boards.

The planes are stacked to form a pyramid, the top of the stack comprising the mother board or the set of mother boards having the smallest area.

The subrack 1 for the electronic circuit boards 2A–2C thus includes large mother boards 3A–3C to the shorter sides of which are fixed female connectors 4A–4C.

Male output connectors 5A–5C can be connected manually to the female connectors 4A–4C. These male output connectors 5A–5C terminate output wiring 10A–10C.

Each type of mother board has one or more female connectors.

The mother boards are disposed parallel to the plane of the front face 6 of the case 9 to form a stack of mother board compartments A–C.

The mother boards have different widths depending on the associated compartment, so that the output wiring 10A–10C can pass to each side of the mother board(s) and is therefore accessible from the front face 6 of the case 9.

The set of mother boards is disposed and retained in the form of a pyramid-shape stack.

By "pyramid-shape stack" is meant a stack of mother boards such that the imaginary exterior envelope defined by the set of mother boards is made up of a succession of steps along the longitudinal axis and/or the radial axis to form a podium along one or both of these axes.

As previously mentioned, the front face 6 of the case 9 faces the mother board or the set of coplanar mother boards having the smallest area.

The construction of the electronic circuit board subrack of the invention entails fixing the various mother boards together by means of spacers 7A–7C.

These spacers 7A–7C are preferably attached to stiffener plates 8B–8D for the mother boards 3A–3C and/or protective plates 8A–8C for the daughter boards 2A–2C.

The subrack as described above may further include at least two mother boards 3A–3C electrically interconnected by at least one of the electronic circuit boards 2A–2C.

To this end the electronic circuit board concerned preferably includes means for automatically connecting it to at least one of the mother boards.

FIG. 2 shows a part-sectional front view of a first preferred embodiment of the electronic circuit board subrack of the invention. The front face 6 of the case 9 is not shown.

FIG. 2 shows the protective plate 8A for the daughter electronic circuit boards on the mother board 3A in the first compartment A, the mother boards 3A–3C of the first, second and third compartments A, B, C, the male output connectors 5A–5C and the spacers 7A–7C fixing the mother boards 3A–3C.

The subrack as a whole can be inserted in the case 9 to which the front face is then fixed.

The overall size, weight and cost of the electronic circuit board subrack can be adapted to suit individual requirements.

Figure 3:
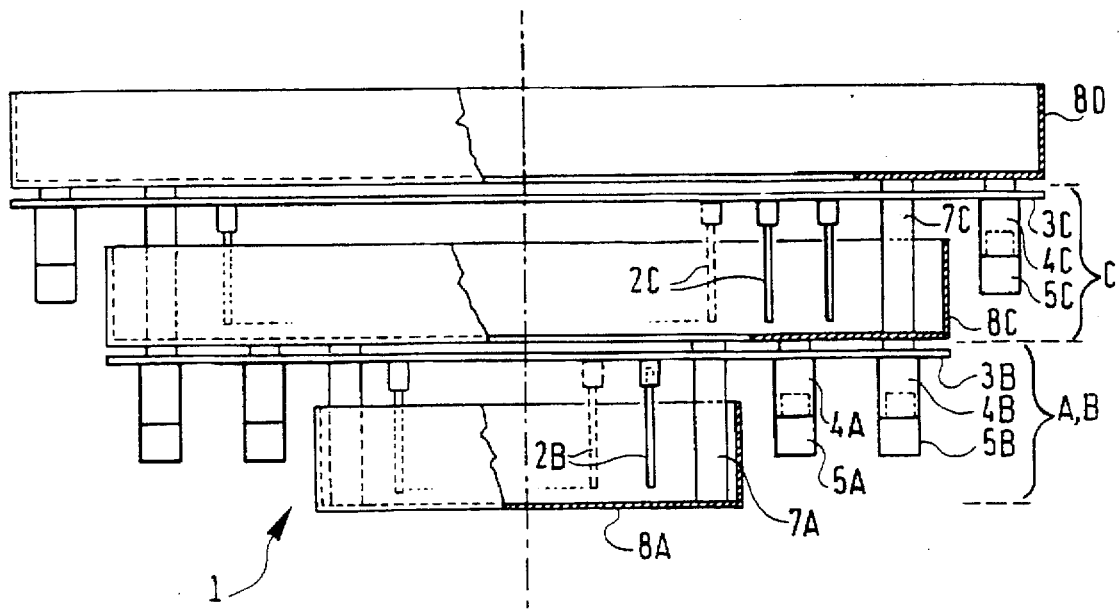
FIG. 3 is a part-sectional top view of the first preferred embodiment of electronic circuit board subrack showing a specific arrangement allowing the provision of four rows of connectors on the mother board of the second compartment.

FIG. 3 is a part-sectional top view of the subrack 1 for circuit boards 2 showing a particular arrangement of the mother board 3B of the second compartment and the first compartment A.

Dispensing with the mother board of the first compartment A and the stiffener and protective plates of the second compartment B enables the provision of four rows of connectors 4A, 5A and 4B, 5B on the mother board 3B of the second compartment B and, as in the previous embodiment, two rows of connectors 4C, 5C on the mother board 3C of the third compartment C.

In this specific embodiment the fixing spacers 7B of the second compartment B have been dispensed with and only the spacers 7A and 7C of the first and third compartments remain.

The stiffener plates 8C and 8D for the mother boards 3B, 3C and the protective plates 8A, 8C for the electronic circuit boards 2B and 2C also remain.

Figure 4:
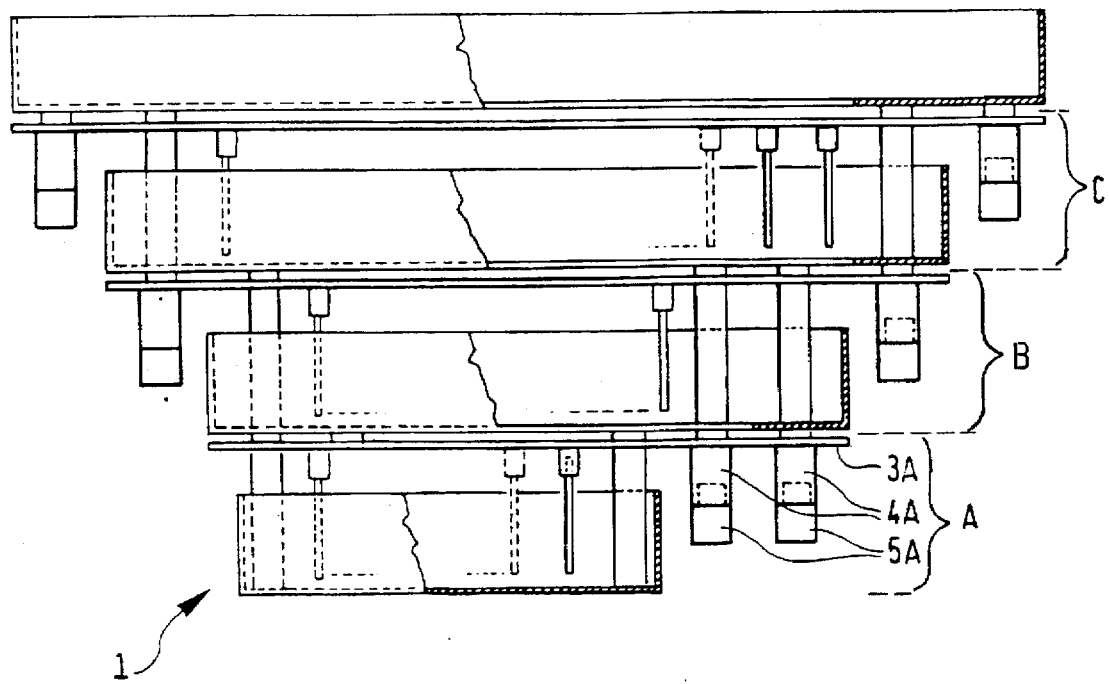
FIG. 4 is a part-sectional top view of the first preferred embodiment of electronic circuit board subrack showing a particular arrangement allowing disposition of the connector on one side of the subrack.

FIG. 4 is a part-sectional top view of the electronic circuit board subrack 1 showing an arrangement of the first compartment A and the second compartment B enabling disposition of all the connectors 4A, 5A on the mother board 3A of the first compartment A on one side of the subrack 1, to be more precise on one side of the mother board 3A of the first compartment A.

In the embodiment shown in FIG. 4, it is possible to shift one of the compartments n (for example the first compartment A) so that it aligns with one side of the previous compartment n−1 or the next compartment n+1 (the second compartment B in FIG. 4).

An arrangement of this kind enables disposition of the connectors at one end of one of the mother boards.

It is also possible to align more than one compartment, for example the compartments A and B, relative to one of the other compartments, for example the compartment C, to obtain a different arrangement of the compartments.

Figure 5:
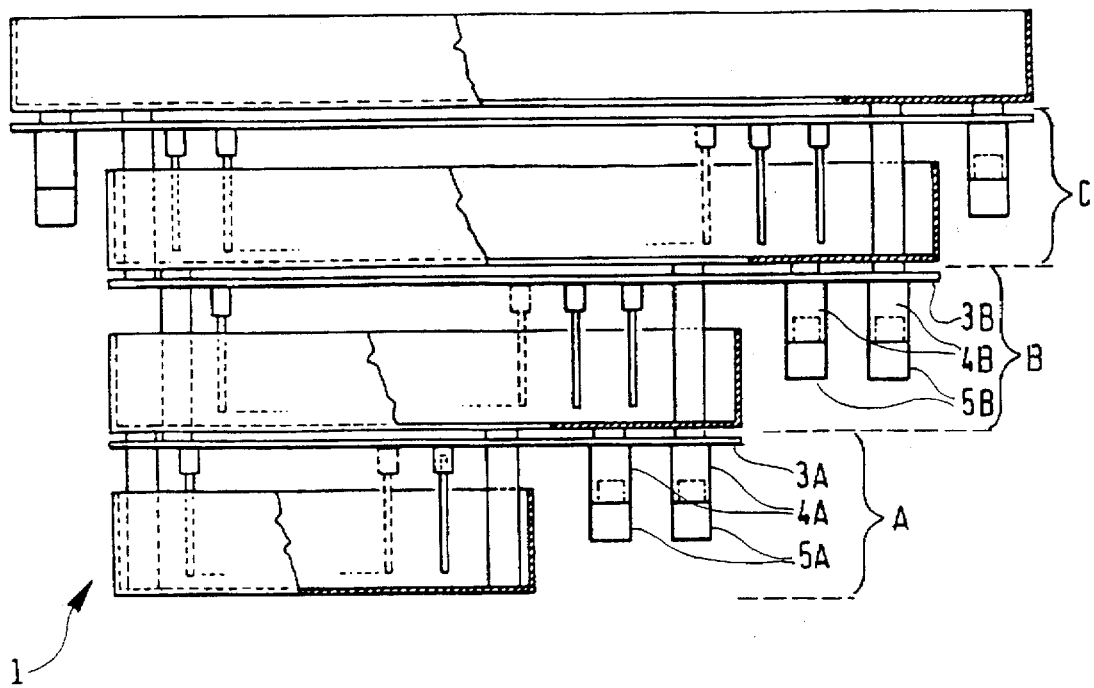
FIGS. 5 and 6 are part-sectional top views of the first preferred embodiment of electronic circuit board subrack showing two other specific arrangements.

FIG. 5 shows one such embodiment.

Figure 6:
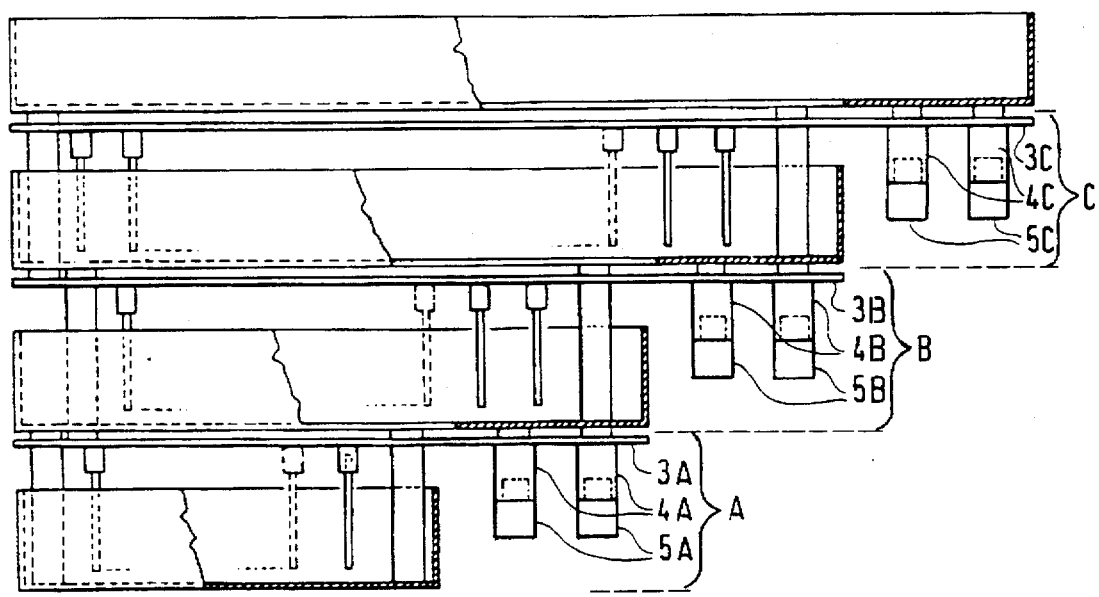

It is also possible to align all of the compartments A–C on one side of the subrack and one such arrangement is shown by way of example in FIG. 6.

An arrangement of this kind enables disposition of all the connectors on a single side of the subrack.

It is possible to choose and combine a great variety of combinations of mother boards in each compartment.

Figure 7A:
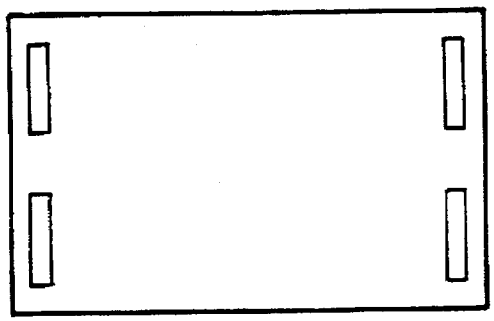
FIGS. 7A through 7F are diagrammatic representations of possible combinations of mother boards for each compartment.
Figure 7B:
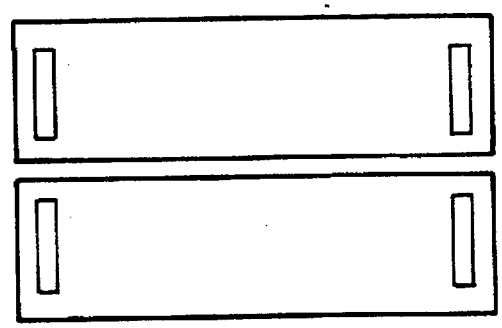
Figure 7C:
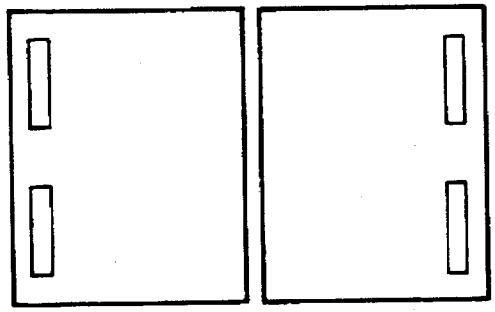
Figure 7D:
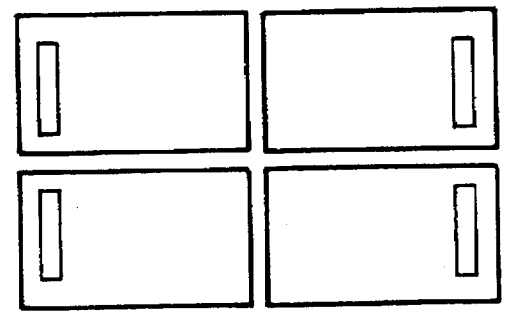
Figure 7E:
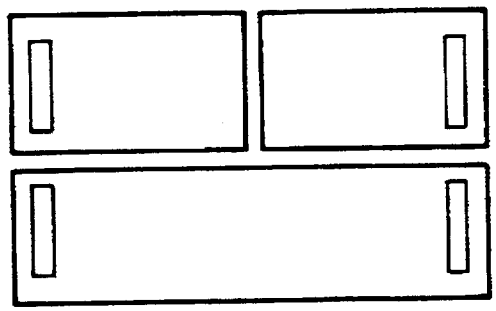
Figure 7F:
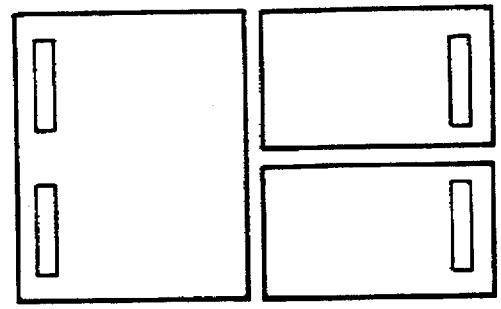

For a subrack comprising six successive compartments, the arrangement of the mother boards in a generally pyramidal shape is obtained by selecting mother boards from the following list:

a single mother board (FIG. 7A), two mother half-boards disposed horizontally (FIG. 7B), two mother half-boards disposed vertically (FIG. 7C), four mother quarter-boards (FIG. 7D), one mother half-board disposed horizontally associated with two mother quarter-boards also disposed horizontally (FIG. 7E), and one mother half-board disposed vertically associated with two mother quarter-boards disposed vertically (FIG. 7F).

It is clear that the mother boards shown in FIGS. 7A through 7F are all the same size but that the sizes of the mother boards differ according to their respective compartment.

Regarding manufacture of the electronic circuit board subrack, the output connectors are wave-soldered to the mother boards, for example.

This has the advantage that the output wiring is incorporated into the volume defined by the front face of the subrack.

The subrack is fixed to its case by means of several screws.

The plates 8A–8D can be adapted to and associated with each compartment in order to brace the boards of the compartment concerned and thus to achieve improved performance in terms of vibration and impact and additionally to provide a heat screen between the compartments.

A subrack including frames of this kind enables fixing of its case by means of screws preferably disposed in the third compartment on the plate 8D.

There is claimed:

1. A subrack comprising at least two mother boards disposed in different planes, said planes each containing one or more of said mother boards, wherein said mother boards are substantially parallel to a front face of said subrack and are superposed to form a stack of compartments in the general shape of a pyramid, and wherein said mother boards have connectors on at least one side adapted to receive output connectors, said connectors of one compartment being offset relative to the connectors of any other compartment so that the connectors are not disposed one above the other and are accessible from the front face of said subrack.

2. Subrack according to claim 1 wherein all of said compartments are aligned with one side of said subrack so that all of the connectors can be disposed on one side of said subrack.

3. Subrack according to claim 1 wherein at least one compartment contains a single mother board.

4. Subrack according to claim 1 wherein at least one compartment contains two mother half-boards.

5. Subrack according to claim 1 wherein at least one compartment contains four mother quarter-boards.

6. Subrack according to claim 1 wherein at least one compartment contains one mother half-board and two mother quarter-boards.

7. Subrack according to claim 1 wherein said mother boards are disposed in planes parallel to said front face of said subrack by means of spacers.

8. Subrack according to claim 1 wherein at least two mother boards are electrically interconnected by at least one of said electronic circuit boards.

9. A subrack comprising at least two mother boards disposed in different planes, said planes each containing one or more of said mother boards, wherein said mother boards are substantially parallel to a front face of said subrack and are superposed to form a stack of compartments in the general shape of a pyramid, and wherein the front face of said subrack faces the mother board or the set of coplanar mother boards having the smallest area.

10. A subrack comprising at least two mother boards disposed in different planes, said planes each containing one or more of said mother boards, wherein said mother boards are substantially parallel to a front face of said subrack and are superposed to form a stack of compartments in the general shape of a pyramid, and wherein at least one mother board from a compartment n is dispensed with in order to dispose four rows of connectors on the mother board of the next compartment n+1.

11. A subrack comprising at least two mother boards disposed in different planes, said planes each containing one or more of said mother boards, wherein said mother boards are substantially parallel to a front face of said subrack and are superposed to form a stack of compartments in the general shape of a pyramid, and wherein at least one mother board of a compartment n is offset so that it aligns with one side of the previous compartment n−1 or the next compartment n+1 so that the connectors of said mother board of said compartment n can be disposed on one side of the subrack.

* * * * *